(12) United States Patent
Kay et al.

(10) Patent No.: US 10,855,287 B2
(45) Date of Patent: Dec. 1, 2020

(54) NON-VOLATILE MULTIPLE TIME PROGRAMMABLE INTEGRATED CIRCUIT SYSTEM WITH SELECTIVE CONVERSION TO ONE TIME PROGRAMMABLE OR PERMANENT CONFIGURATION BIT PROGRAMMING CAPABILITIES AND RELATED METHODS

(71) Applicant: The United States of America, as represented by the Secretary of the Navy, Crane, IN (US)

(72) Inventors: Matthew James Kay, Bloomington, IN (US); Matthew John Gadladge, Bloomington, IN (US); Adam Ray Duncan, Bloomington, IN (US); Brett J. Hamilton, Heltonville, IN (US); Andrew Mark Howard, Bloomington, IN (US)

(73) Assignee: United States of America, as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/520,591

(22) Filed: Jul. 24, 2019

(65) Prior Publication Data
US 2019/0348986 A1    Nov. 14, 2019

Related U.S. Application Data

(63) Continuation of application No. 16/281,051, filed on Feb. 20, 2019, now abandoned.
(Continued)

(51) Int. Cl.
*H03K 19/177* (2020.01)
*H03K 19/1776* (2020.01)
(Continued)

(52) U.S. Cl.
CPC ........ *H03K 19/1776* (2013.01); *G11C 11/161* (2013.01); *G11C 11/1673* (2013.01);
(Continued)

(58) Field of Classification Search
None
See application file for complete search history.

(56) References Cited

U.S. PATENT DOCUMENTS

| 6,751,149 B2 | 6/2004 | Seyyedy et al. |
| 8,547,736 B2 | 10/2013 | Rao et al. |

(Continued)

*Primary Examiner* — Seokjin Kim
(74) *Attorney, Agent, or Firm* — Naval Surface Warface Center Crane Division; Christopher A. Monsey (57) ABSTRACT

Various embodiments include providing a MTJ-based LUT and adding a system that short circuits or causes dielectric layer breakdown of selected MTJ junctions to permanently finalize a desired logic state configuration of selected MTJs that is read out by the LUT. Additional embodiments disable dielectric layer breakdown or short circuit control circuits to prevent further alterations to MTJ that have not had their dielectric layers broken down or shorted out. A control system then alters reading out the MTJ-based LUT to sense original higher and lower resistance values of un-shorted/altered MTJs as a higher resistance state and a shorted or dielectric layer that has been broken down as a lower resistance state. This combines the flexibility of a multiple-time programmable LUT-based FPGA with the security and reliability of a one-time programmable LUT-based FPGA which has characteristics of a fixed logic non-programmable integrated circuit or application specific integrated circuit (ASIC).

4 Claims, 11 Drawing Sheets

Related U.S. Application Data (60) Provisional application No. 62/633,011, filed on Feb. 20, 2018.

(51) Int. Cl.
  *H03K 19/17728* (2020.01)
  *G11C 11/16* (2006.01)
  *H03K 19/17764* (2020.01)
  *G11C 17/16* (2006.01)
  *H03K 19/17768* (2020.01)

(52) U.S. Cl.
  CPC .......... *G11C 11/1675* (2013.01); *G11C 17/16* (2013.01); *H03K 19/17728* (2013.01); *H03K 19/17764* (2013.01); *H03K 19/17768* (2013.01)

(56) References Cited

U.S. PATENT DOCUMENTS

| | | | |
|---|---|---|---|
| 9,070,465 B2 | 6/2015 | Son et al. | |
| 9,245,610 B2 | 1/2016 | Kim et al. | |
| 9,805,816 B2 | 10/2017 | Jan et al. | |
| 10,210,920 B1 | 2/2019 | Chen et al. | |
| 2013/0148409 A1* | 6/2013 | Chung | G11C 17/18 365/148 |
| 2013/0215663 A1* | 8/2013 | Chung | G11C 13/0002 365/100 |
| 2014/0071740 A1 | 3/2014 | Kim et al. | |
| 2016/0125953 A1 | 5/2016 | Kim et al. | |
| 2017/0110171 A1* | 4/2017 | Seo | G11C 11/1673 |
| 2017/0263336 A1* | 9/2017 | Nakayama | G11C 29/44 |
| 2018/0212607 A1* | 7/2018 | Oda | H03K 19/17792 |
| 2018/0358369 A1* | 12/2018 | Lee | G11C 17/16 |
| 2019/0051341 A1* | 2/2019 | Li | G11C 29/50 |
| 2019/0326508 A1* | 10/2019 | Perrissin-Fabert | H01L 43/08 |
| 2019/0363131 A1* | 11/2019 | Torng | H01L 45/08 |

* cited by examiner

NON-VOLATILE MULTIPLE TIME PROGRAMMABLE INTEGRATED CIRCUIT SYSTEM WITH SELECTIVE CONVERSION TO ONE TIME PROGRAMMABLE OR PERMANENT CONFIGURATION BIT PROGRAMMING CAPABILITIES AND RELATED METHODS

CROSS-REFERENCE TO RELATED APPLICATION

This application claims priority to U.S. Provisional Application Ser. No. 62/633,011 filed on Feb. 20, 2018 and a corresponding Non Provisional Ser. No. 16/281,051 filed on Feb. 20, 2019 the disclosures of which is expressly incorporated herein by reference.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,600, 200,496 and 200,488) is assigned to the United States Government and is available for licensing for commercial purposes. Licensing and technical inquiries may be directed to the Technology Transfer Office, Naval Surface Warfare Center Crane, email: Cran_CTO@navy.mil.

FIELD OF THE INVENTION, SUMMARY, AND BACKGROUND

The present invention relates to exemplary embodiments associated with creating and using a non-volatile multiple time programmable (MTP) integrated circuit system with selective conversion to one time programmable (OTP) or permanent configuration bit programming capabilities and related methods. In particular, at least some embodiments include systems that include non-volatile MTP magneto-tunnel junction-based (MTJ) field programmable gate array (FPGA) look up table (LUT) with circuitry which provides an ability to permanently finalize MTJ bit configurations in selected MTJs using existing FPGA architectures or via various added permanent bit configuration conversion circuitry which transitions selected MTJ bits in an exemplary FPGA from a reprogrammable or MTP capability to a OTP capability.

In one set of embodiments, MTJ-based cells allow increased write endurance performance compared to existing non-volatile flash-based FPGAs. MTJ-based cells also offer increased switching times compared to volatile SRAM-based FPGAs. Addition of permanent configuration bit programming capabilities solves a variety of reliability problems where configuration bits experience errors due to environmental or malicious stimuli. A result of various exemplary methods provides a first realization of a FPGA achieving the flexibility and programmability of a MTP FPGA with the security and reliability of an OTP FPGA.

Exemplary applications of various embodiments of this invention or disclosure can include providing a MTP MRAM-based FPGA with permanent programming capabilities. For DoD and aerospace applications, embodiments of the invention can provide radiation hardened MTP FPGAs. Another set of applications can include new mechanisms for securely storing the configuration bits within an FPGA that provide resistance to tampering, unauthorized reprogramming, undesired or malicious actor techniques.

Figure 1:
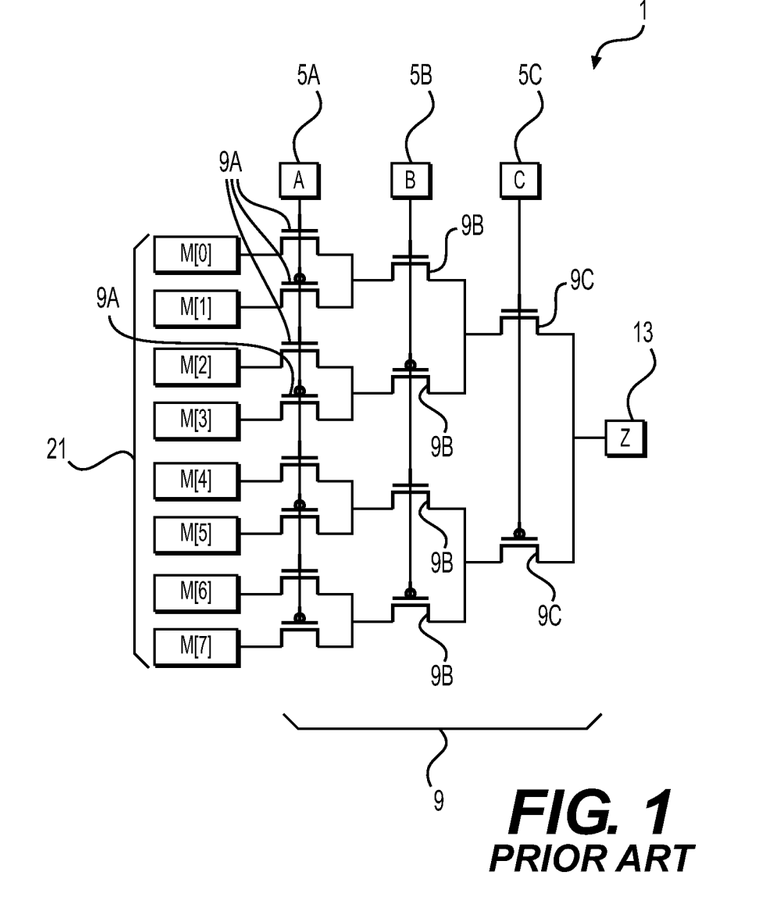
FIG. 1 shows an exemplary three-input LUT design for an FPGA architecture.

Referring to FIG. 1, one of a variety of fundamental building blocks of an FPGA section's 1 programmable memory 21 section (e.g., MTJs) and a lookup table (LUT) 9 (e.g., a readout bus for selecting one of the programmable memory sections 21 in a many to one relationship that includes a number of transistors, e.g., 9A, 9B, 9C that are operated or addressed by inputs on one or more select bus lines e.g., 5A, 5B, 5C). A LUT-based FPGA section 1 operates by storing its configuration values in on-chip memory (e.g., MTJs 11) which are read out by the exemplary LUT 9 as shown in FIG. 1. Exemplary 'programming' of an FPGA section 1 can be done by changing configuration values (or memory cells 21) which are read out by the LUT 9. In FIG. 1, M[0] to M[7] 21 represent memory cells that are used to configure logical behavior of the FPGA section 1. The inputs A, B, C to the select bus lines 5A, 5B, and 5C provide inputs to LUT 9 transistors 9A, 9B, 9C and an exemplary LUT 9 output is represented as Z 13. For example, M[0:7]=10101010 represents a logical OR between inputs A:C. Similarly, M[0:7]=10000000 represents a logical AND between inputs A:C to select bus lines 5A, 5B, and 5C which operate LUT transistors 9A, 9B, and 9C and thereby address specific memory cells 21 (e.g., M(0) to M(7)).

Figure 2:
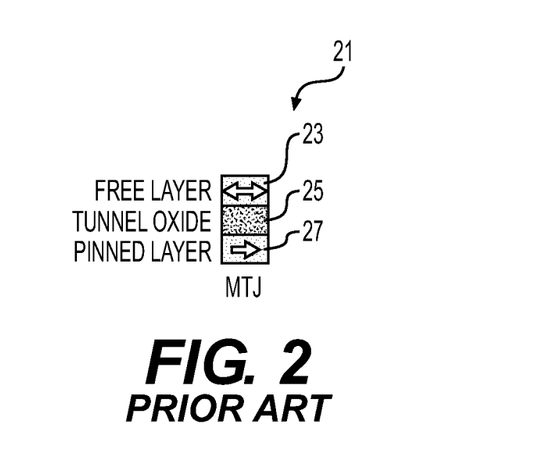
FIG. 2 shows a simplified exemplary MTJ including three primary layers.

Referring to FIG. 2, one type of non-volatile memory cell that has previously been used or attempted to be used store LUT configuration bits is a MTJ. Tunnel magnetoresistance (TMR) is a magnetoresistive effect that occurs in a MTJ, which is a component that can include, e.g., two ferromagnets or magnetic layers separated by a thin insulator. If the insulating layer is thin enough, electrons can tunnel from one ferromagnet or magnetic layer into the other. Tunnel magnetoresistance is a quantum mechanical phenomenon. A direction of magnetizations of the magnetic or ferromagnetic films or layers can be switched individually by an external magnetic field from a write bus line (not shown). If the layers' magnetization field orientations are in a parallel orientation, it is more likely that electrons will tunnel through the insulating film or layer than if they are in the oppositional (antiparallel) orientation. Consequently, such a junction can be switched between two states of electrical resistance, one with lower and one with higher or very high resistance which can be read by a read bus (not shown). Application of MTJs include memory devices such as shown, e.g., in U.S. Pat. No. 6,903,396, Control of MTJ Tunnel Area, the disclosure of which is incorporated herein as one example of a MTJ in a memory device which might be used in an exemplary FPGA assembly.

In particular, an exemplary MTJ 21 can include three layers 23, 25, 27 as shown in FIG. 2. A "Pinned Layer" 27 has a fixed magnetization orientation. A "Free Layer" 23 has a magnetization field orientation that can be changed dependent upon the magnitude and direction of current flow in the MTJ cell addressing bus (not shown) which runs current perpendicular to the free layer's magnetic field orientation and thereby under the right hand rule creates an electromagnetic field which can flip the Free Layer's 23 magnetic field orientation one way or another depending on direction of current flow. A "Tunnel Oxide" layer 25 is formed between the Free Layer 23 and the Pinned Layer 27.

Figure 3A:
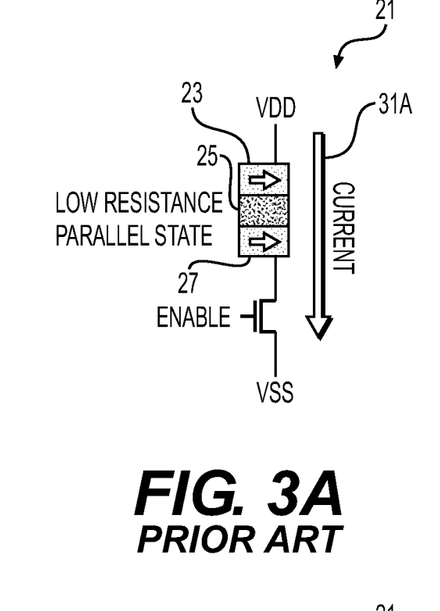
FIGS. 3A and 3B shows directions of current flow used to toggle exemplary MTJ cell resistance values.
Figure 3B:
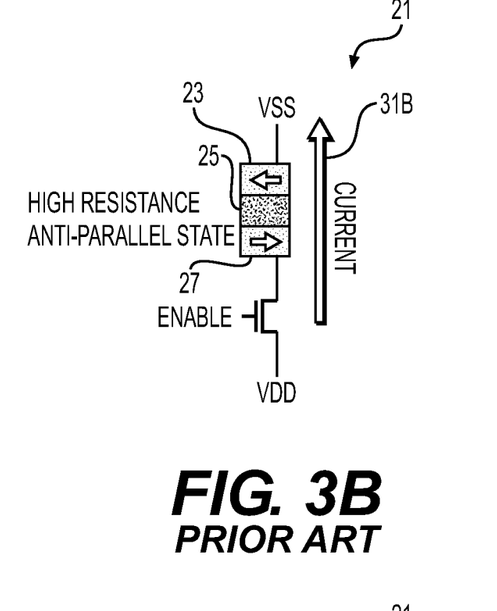
Figure 4A:
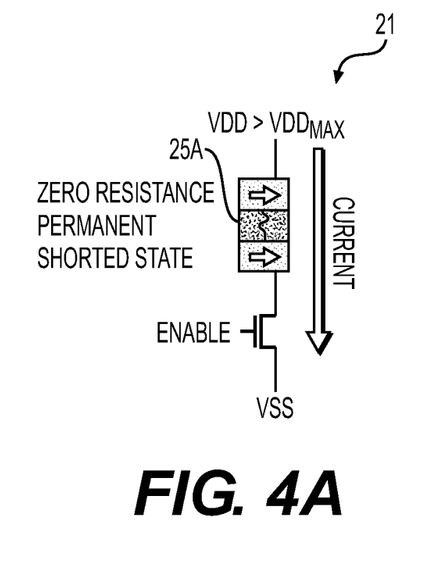
FIGS. 4A and 4B shows tunnel oxide experiencing MTJ dielectric layer breakdown triggered by a high electric voltage or fields resulting in a direct short or dielectric layer breakdown between a MTJ free layer and pinned layer.
Figure 4B:
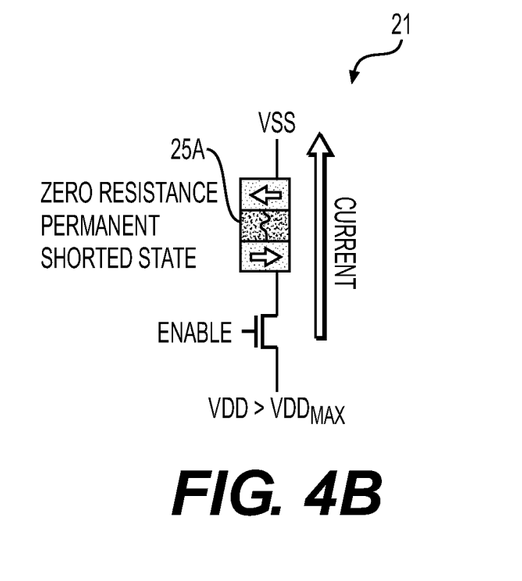

Referring to FIGS. 3A and 3B, changes to the free layer's 23 magnetization orientation alters the MTJ cell 21 resistance from a higher resistance level (FIG. 3A) to a lower resistance level (FIG. 3B). Parallel orientations of the free layer 23 and pinned layer 27 magnetic fields create a lower resistance to passage of electrical current or signals through the MTJ 21 while opposite orientations of the free layer 23 and pinned layer 27 magnetic fields will increase resistance to current passage through the MTJ 21. The middle layer 25 of the MTJ 21 includes a dielectric, such as MgO, that is subject to dielectric breakdown if an electric field across the dielectric layer 25A exceeds a certain threshold (e.g., application of a short circuit or MTJ dielectric layer 25 breakdown voltage). MTJ dielectric breakdown is a reliability concern with MTJs and can cause a direct short across the selected MTJ cell 21 as seen in FIGS. 4A and 4B. MTJ dielectric layer 25A breakdown normally is an undesirable condition that is to be avoided given it is associated with catastrophic damage to the MTJ which can occur from a variety of damage events including radiation events or other damage causing events such as electromagnetic field caused damage. Various embodiments of the invention can take advantage of this undesirable dielectric breakdown to permanently change resistance values through an exemplary improved MTJ-based LUTs as described herein. The FIGS. 4A and 4B MTJs 21 have a higher voltage applied than is normal for use with the MTJ 21 which is sufficient to cause the dielectric layer 25A breakdown and consequent reduction of resistance through the MTJ. (e.g., see FIG. 13, lowered MTJ resistance value 127 after application of dielectric breakdown voltage to a selected MTJ 21).

Figure 5:
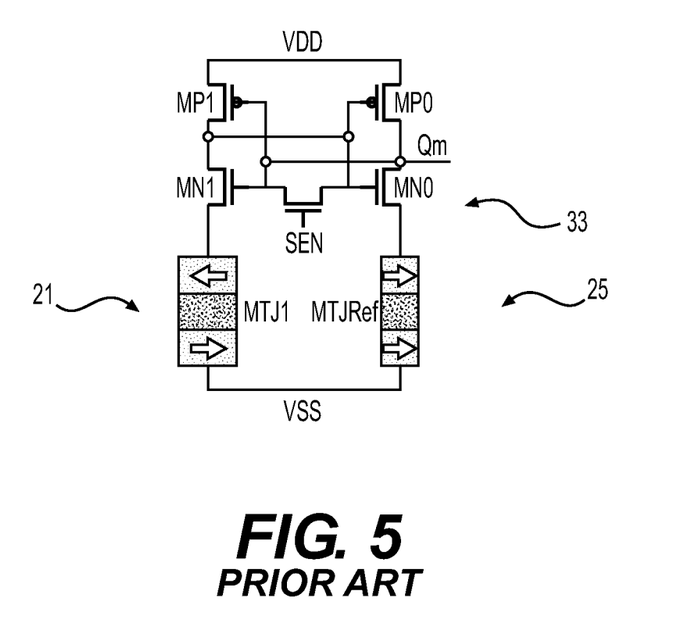
FIG. 5 shows an exemplary sense amplifier used to convert a sensed resistance difference between a coupled MTJ cell (read out by an exemplary LUT) and a MTJ reference cell into a digital value.

Referring to FIG. 5, a MTJ-based LUT can include a sense amplifier or sense amp 33. The exemplary sense amp 33 is used to compare two resistances (sensed and reference) and produce a digital value indicating which resistance is greater. An exemplary design for a sense amp 33 utilized with an exemplary MTJ-based LUT design is shown in FIG. 5.

Figure 6:
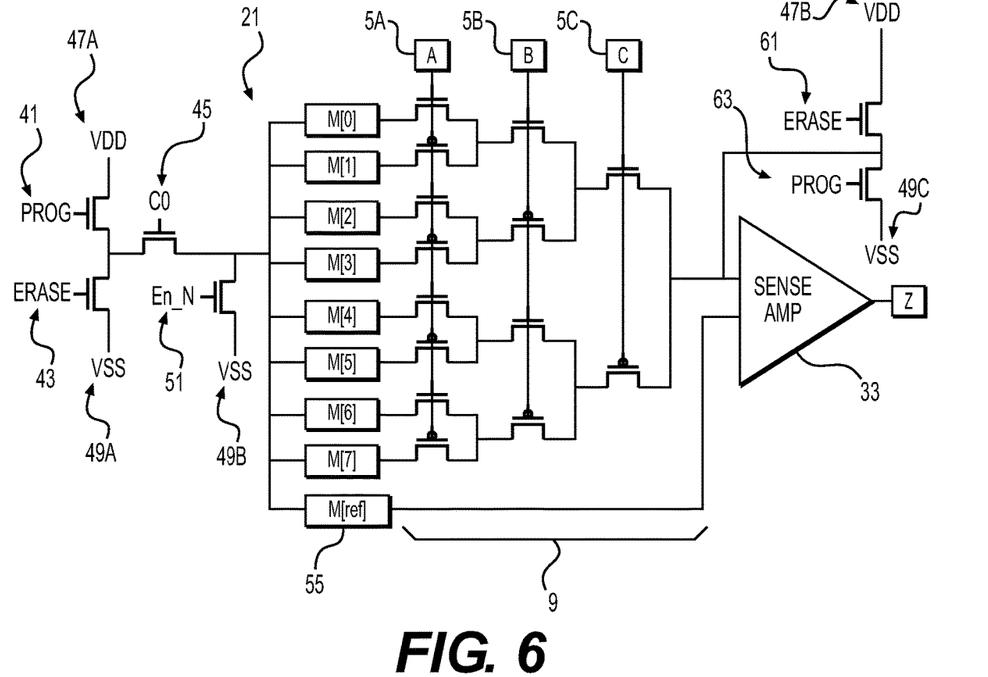
FIG. 6 shows a schematic of an exemplary MTJ-based LUT with sense amplifier and "Prog" and "Erase" signals used to change the resistance between MTJ cells M[0:7] as selected by inputs A:C.

An exemplary MTJ-based LUT section is shown in FIG. 6. The exemplary FIG. 6 schematic shows a MTJ-based LUT including a number of MTJs 21 that are coupled with an exemplary LUT 9 that selectively couples an exemplary sense amplifier 33 with particular MTJs 21. The FIG. 6 drawing also shows "Prog" and "Erase" control circuits (61, 63) coupled with the sense amplifier 33. The "Prog" (41, 63) and "Erase" (43, 61) selectively coupled VDD (47A or 47B) with VSS (49A or 49C) inputs through the MTJs 21 and LUT 9 to enable programming and erase signals to pass through MTJs 21 selected by the LUT 9 and select bus lines 5A, 5B, 5C that thereby change a resistance value between MTJ cells M[0:7] 21. The LUT 9 selectively addresses specific MTJs 21 based on select bus line inputs A:C (5A, 5B, 5C). The FIG. 6 embodiment further includes circuitry for reading the memory cells M[0:7] 21 (e.g., closing read enable transistor 51 and possibly opening isolation transistor 45 which couples VSS 49B to the MTJs 21). A reference signal MTJ 55 is coupled with and provides a reference signal (e.g. see FIG. 13, 123) to sense amp 33 which then outputs a value or signal "Z" associated with comparison of compared inputs. In various embodiments, writing a "1" can be referred to a "Programming" or "Prog" and writing a "0" to an individual MTJ 21 can be referred to as "Erasing" or "Erase" in this case and throughout this disclosure. Examples of each case will follow.

Figure 7:
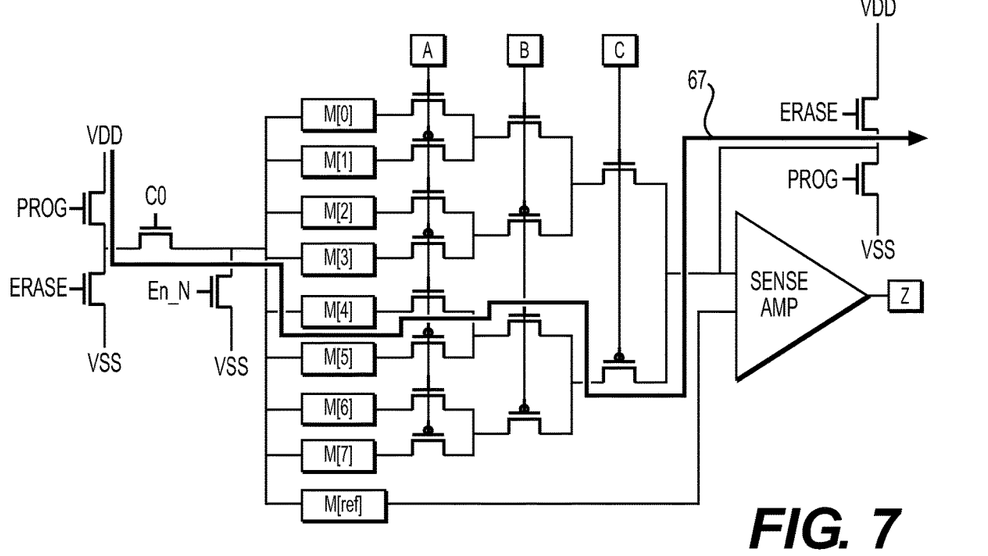
FIG. 7 shows an exemplary program operation causing a positive current flow path across a selected MTJ cell M[4]

An exemplary "Program" operation using the FIG. 6 embodiment is shown in FIG. 7 which shows the FIG. 6 embodiment with a "program" circuit path 67 passing through various FIG. 6 components. An exemplary program sequence begins by configuring various components to enable an electrical path between VDD 47A and program VSS 49C. A control system (not shown) enables or creates an electrical path 67 through the LUT 9 from a desired MTJ memory cell, e.g., "M(4)" to an output of the LUT 9 based on the select bus line inputs (e.g., A:C inputs 5A, 5B, 5C into the LUT 9). A controller will then deassert a read enable signal En_N via read enable transistor 51 then assert the Prog signal path by closing or asserting Prog transistor pairs 41/63. At this point, current flows from VDD 47A to VSS 49C through only the selected MTJ "M(4)" to change a spin or orientation of the selected MTJ 21 M(4) free layer and thus its resistance value (higher or lower). Erase transistor pair 43/61 plus read enable transistor 51 are open to enable this Program operation in this embodiment.

Figure 8:
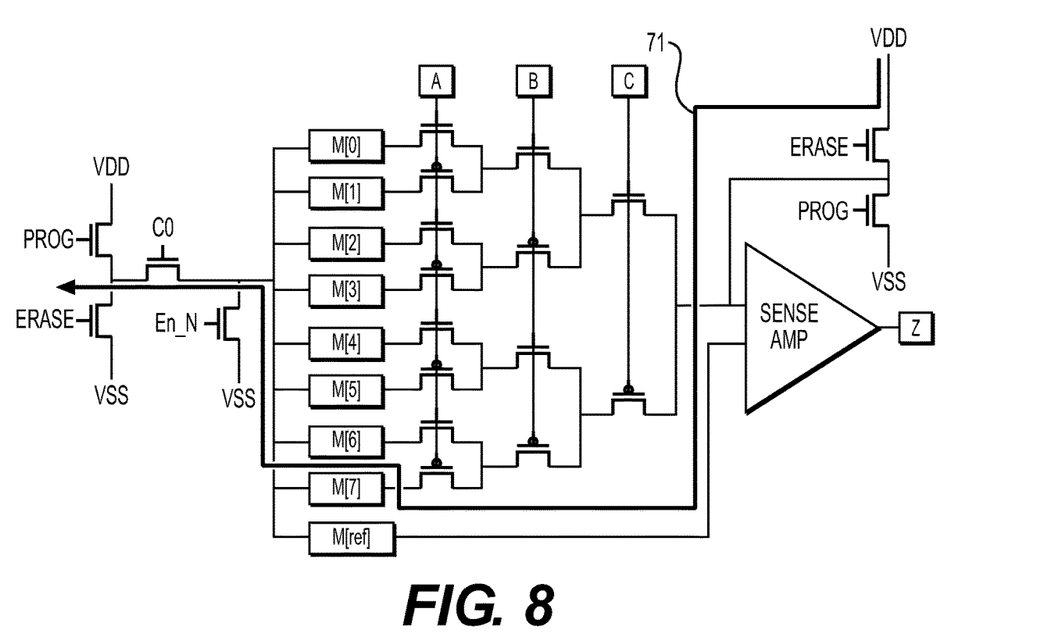
FIG. 8 shows an exemplary erase operations with resulting electrical path causing negative current flow across a selected MTJ cell M[7]

Similarly, an "Erase" operation that enables an exemplary Erase signal path 71 through the FIG. 6 embodiment is shown in FIG. 8. This exemplary Erase operations starts by selecting a desired MTJ memory cell 21, e.g., "M(7)", with the LUT 9 A:C inputs 5A, 5B, 5C; then deasserting the read enable signal EN_N transistor 51 then asserting the Erase signal transistor pairs 43/61. At this point, current flows in the opposite direction from that of FIG. 7 from VDD 47B to VSS 49A through only the selected MTJ 21, e.g., "M(7)", to change a spin or orientation of the MTJ 21 M(7) free layer and thus its resistance.

Figure 9:
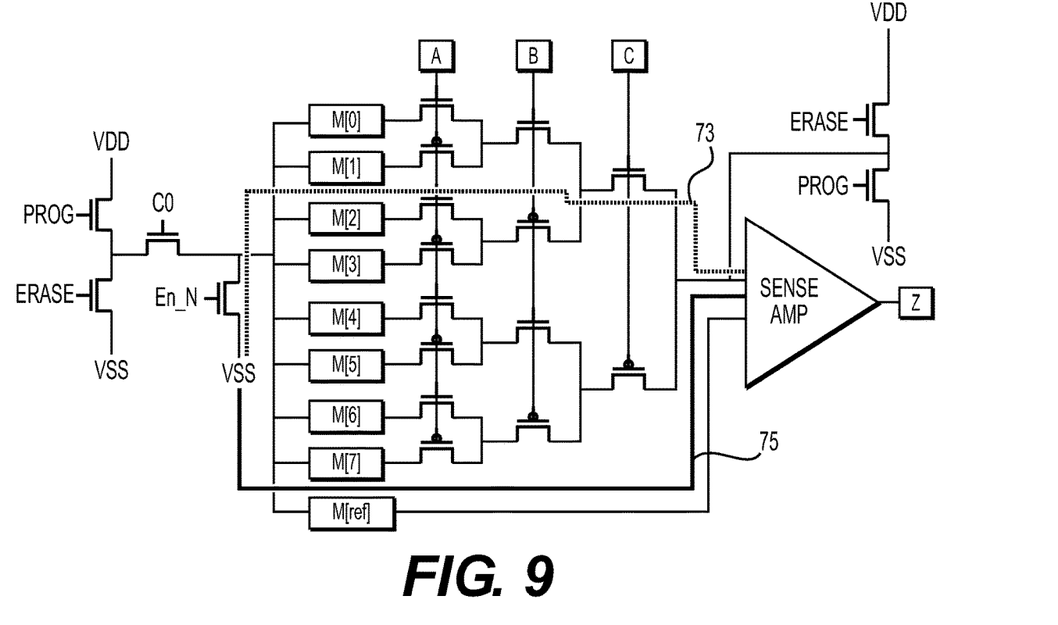
FIG. 9 shows an exemplary read operation utilizing an exemplary sense amp to compare resistance in a selected MTJ M[2] with reference MTJ M[ref] that results in or creates a digital logic value Z output.

Exemplary "Read" operation signal paths 73, 75 are shown in FIG. 9. The exemplary Read operation starts by selecting a desired MTJ memory cell 21, e.g., "M(2)", with the A:C inputs 5A, 5B, 5C, then asserting the read enable signal En_N transistor 51, then deasserting the Co isolation transistor 45. At this point, there is a resistance path 71 through the LUT 9 selected MTJ M(2) between a sense amp 33 input and ground VSS 49B. The other sense amp 33 input path includes the reference MTJ, M[ref] 55. The sense amp 33 compares these two resistances and produces a '1' or '0' to indicate whether the resistance of the LUT 9 selected MTJ 21 M(2) was higher or lower than the reference MTJ 55 signal value.

Various embodiments take an existing MTJ-based LUT concept and have added structures/processing operations enabling an ability to short or cause dielectric layer breakdown of selected MTJs to cause permanent finalizing of desired MTJ logic state configuration that are read out by an associated LUT. Various embodiments combine the flexibility of a multiple-time programmable (MTP) LUT-based FPGA with the security and reliability of a one-time programmable (OTP) LUT-based FPGA.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 10:
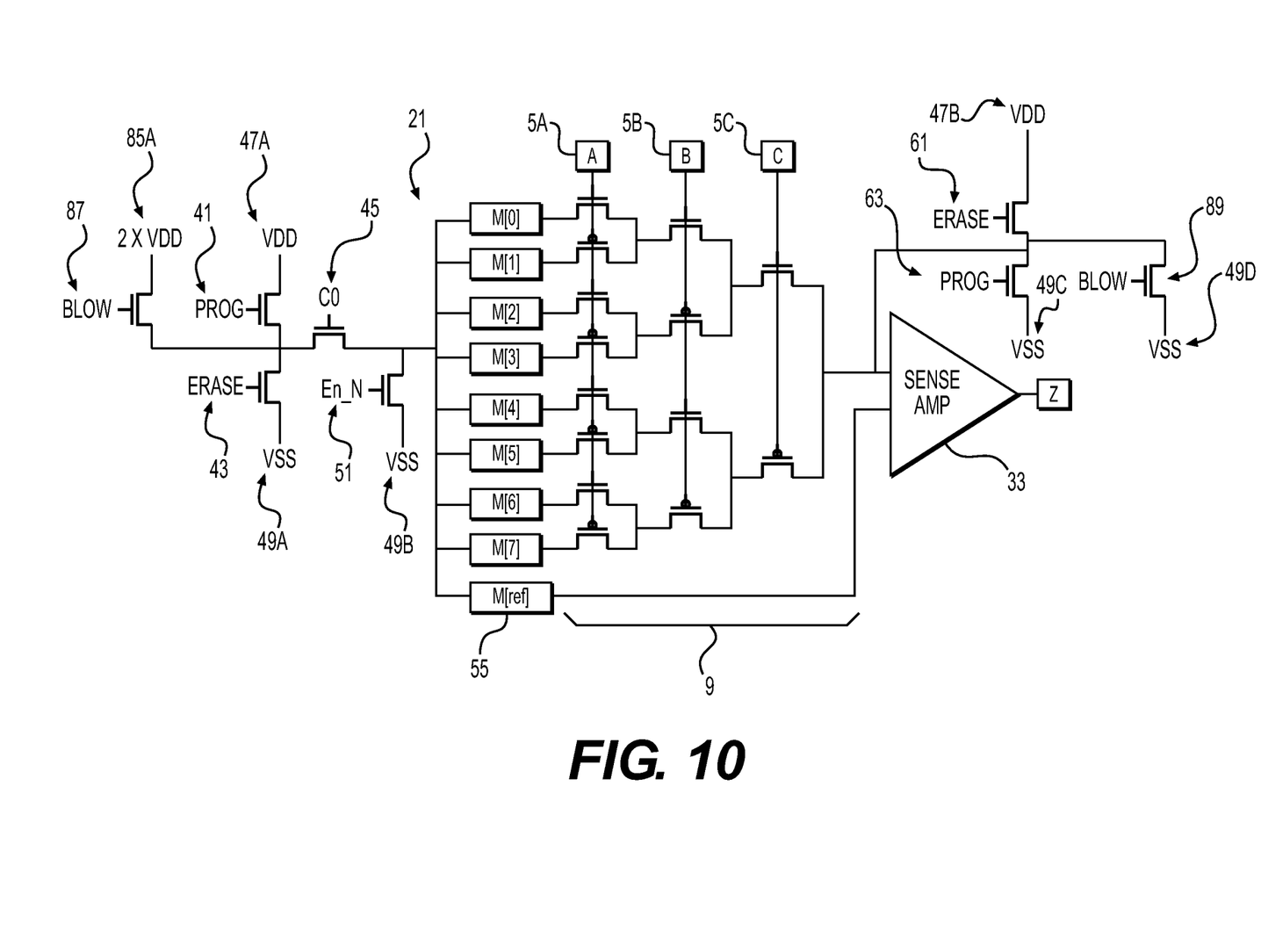
FIG. 10 shows a first embodiment that includes transistors added to MTJ-based LUT for permanently causing dielectric layer breakdown of one or more selected MTJs.

Referring to FIG. 10, a first embodiment of the invention is shown that includes dielectric breakdown control circuits 87, 89 and higher voltage sources 85A/ground sources 49D added to the simplified MTJ-based LUT shown in FIG. 6 for selectively causing permanent dielectric layer 25 breakdown of one or more MTJs 21 selected via LUT 9/select bus line input (A 5A, B 5B, C 5C). FIG. 10 shows an addition of a "Blow" signal input transistor pair (97, 89) to control the switching of a voltage high enough to cause dielectric layer 25 breakdown in selected MTJs 21. This exemplary higher voltage can be referred to as "2×VDD" 85A and can be calculated in at least some embodiments according to the voltage division between the existing MTJ series resistance and small series Rds series resistances from switching transistors. The exemplary "2×VDD" voltage source 85A can then be adjusted so that it provides a desired electric field across a LUT 9/select bus line input 5A, 5B, 5C selected MTJ dielectric layer 25 in a predetermined or desired time frame for the specific dielectric material and geometry. In general, the higher the voltage applied to the dielectric layer 25, the less time required to cause dielectric layer 25 breakdown.

Figure 11:
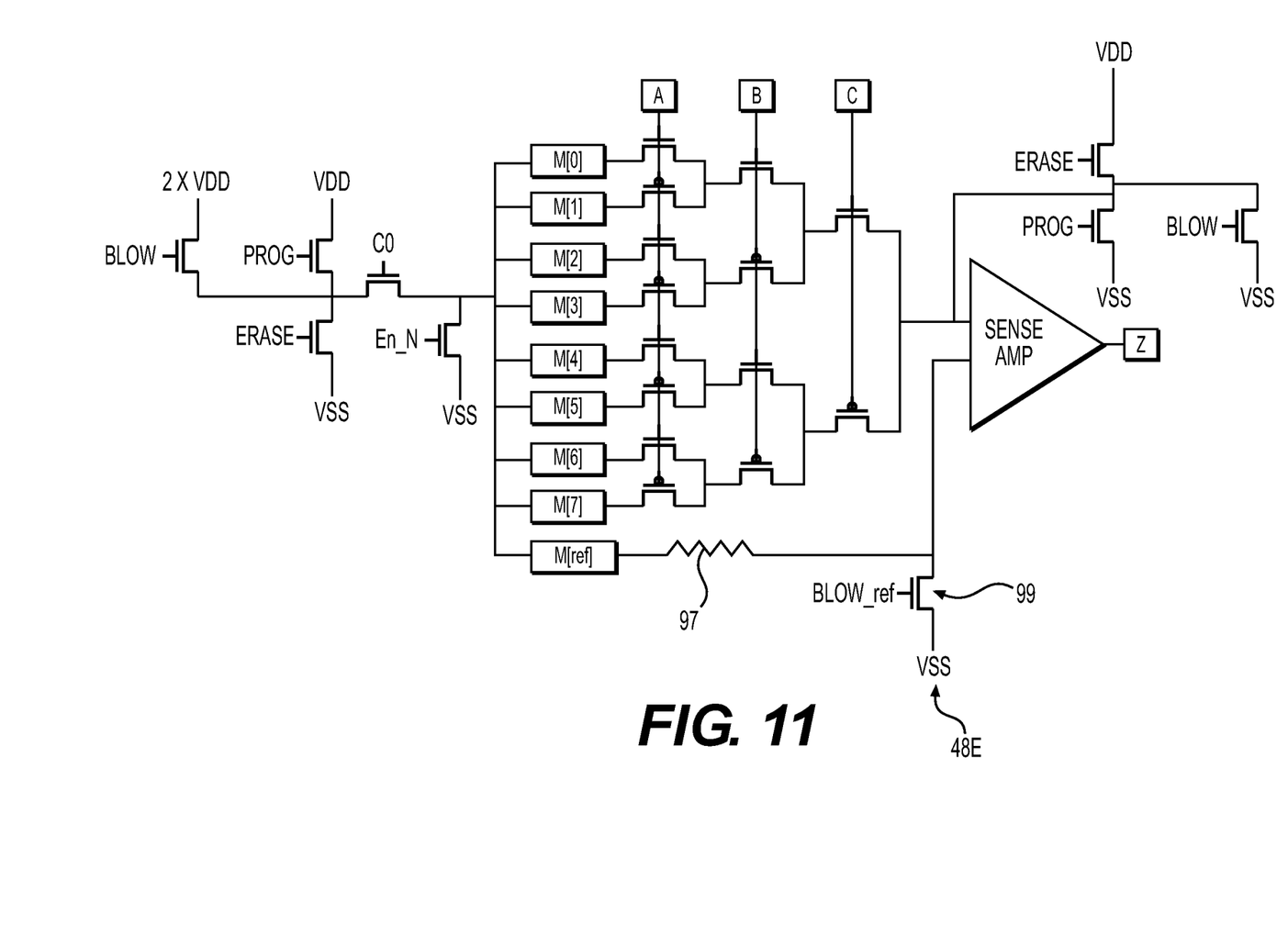
FIG. 11 shows a second embodiment that includes circuitry added to reference MTJ to increase margin for distinguishing between blown and non-blown cells.
Figure 13:
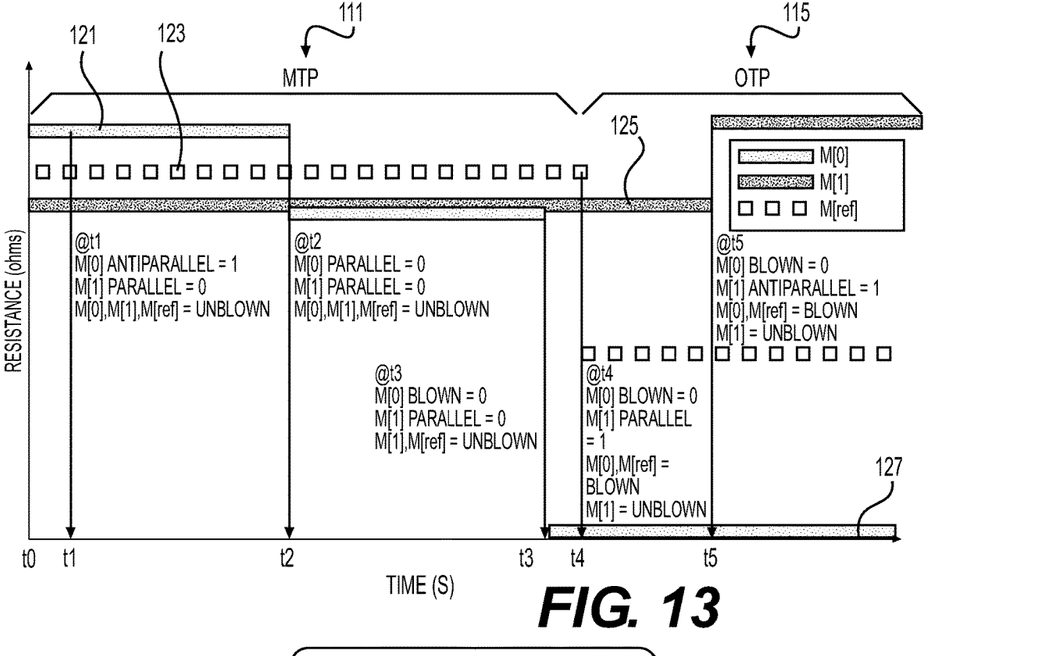
FIG. 13 shows an exemplary timing diagram illustrating different events in MTP and OTP mode.

FIG. 11 shows a second embodiment that includes the FIG. 10 embodiment with additional circuitry 97, 99, 48E added to the reference MTJ 55 and system shown in FIG. 10 to increase a margin for distinguishing between dielectric layer 25 that are blown/have experienced breakdown and non-blown MTJ cells 21. This second implementation adds additional circuitry to the reference MTJ bit 55 to increase a margin between a blown/dielectric layer breakdown condition or resistance and unblown MTJ 21 with higher resistance values such as shown in FIG. 13. A series resistance 97 is added to M[ref] 55 that serves as a path for "2×VDD" 85A signals to flow through M[ref] 55. Upon assertion of the blow signal transistor 87, the M[ref] 55 will be shorted while leaving the series resistor 97 connected to the reference port of the sense amp 33. An exemplary value of the series resistor 97 can be between zero and a lowest possible parallel MTJ 21 state. Thus, a new threshold of the sense amp 33 will simply distinguish between blown/MTJ cells with dielectric layer breakdown and unblown MTJ cells. The M(ref) MTJ 97 can have its dielectric layer 25 shorted or experience dielectric layer breakdown by configuring the LUT to isolate all non-M(ref) MTJs 21 from the 2×VDD 85 signal when it is applied via the blow transistor 87 so that the "2×VDD" 85 signal is passed through the M(ref) MTJ and through an asserted or closed blow_ref transistor 99 to create an electrical path to VSS 48E.

Figure 12:
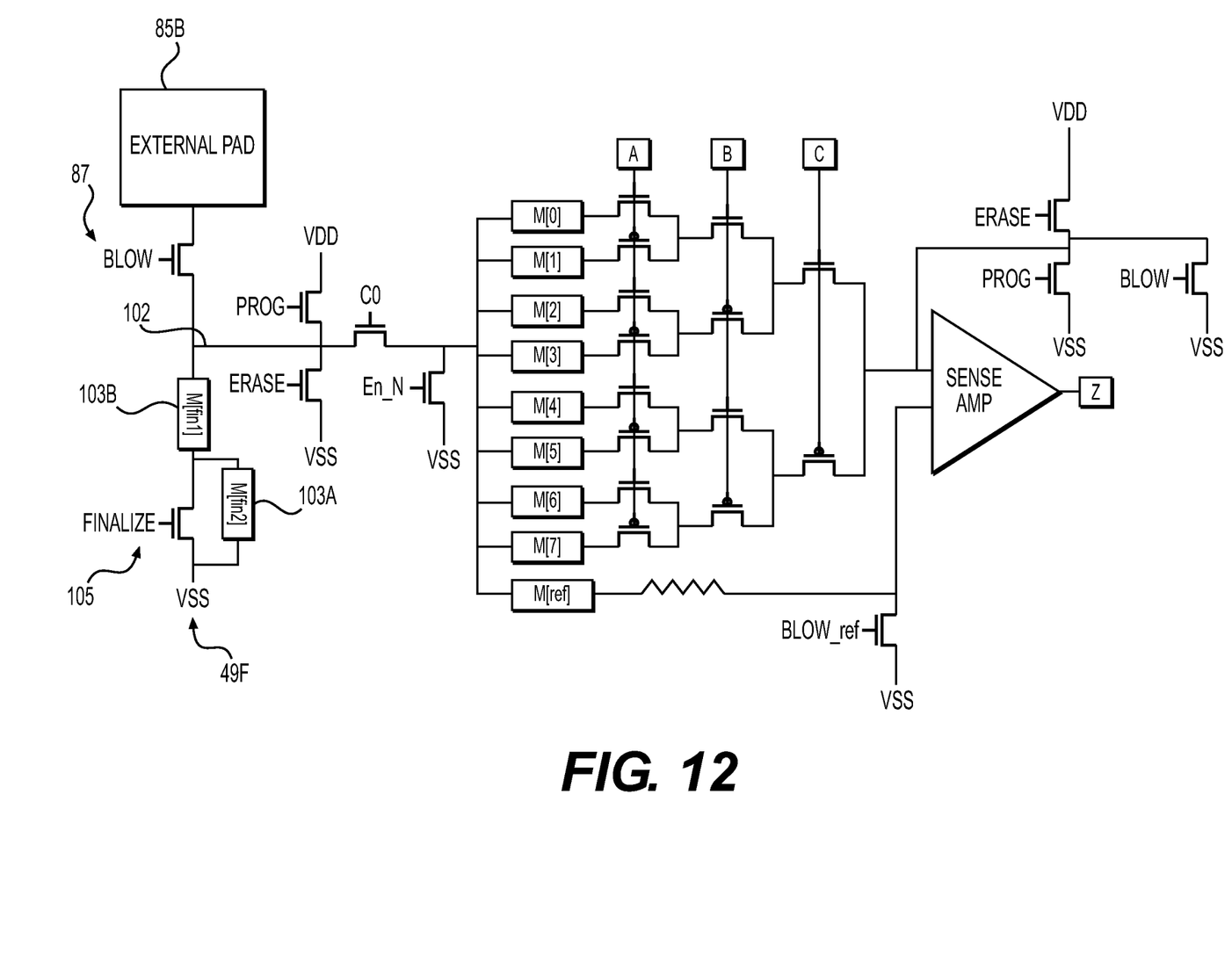
FIG. 12 shows a third embodiment that includes circuitry added to remove potentially hazardous on-chip voltage and short the pad to VSS, preventing further unwanted dielectric breakdowns of MTJ cells once the finalization has taken place.

FIG. 12 generally shows a third embodiment that includes the FIG. 11 embodiment with additional circuitry 85B, 87, 103B, 105, 103A, and 49F added to remove potentially hazardous on-chip voltage and short an external pad 85B to VSS (e.g., "2×VDD" supplied externally to the pad 5B) and preventing further unwanted dielectric layer breakdown of LUT 9/select bus line input 5A, 5B, 5C selected MTJ cells 21 once a configuration finalization input has been supplied by an operator or a control system (not shown). This third exemplary implementation adds additional reliability by providing a set of MTJs 103A, 103B to permanently disable a "2×VDD" path (or higher voltage) from accidentally (e.g. via a radiation event or other malfunction/damage event) or malicious actor event causing dielectric layer 25 breakdown of MTJs 21 that are not intended to be shorted after the OTP conversion or finalization input has been received. An isolation transistor 45 selectively isolates the MTJ sections 21 and the read enable transistor 51 from a second dielectric breakdown control circuitry section (85A, 87), a third dielectric breakdown control circuity section (103A, 103B, 105, 49F), the program signal input transistor 41 and the erase signal input transistor 43.

In particular, FIG. 12 shows an external pad 85B that has been added to the FIG. 11 FPGA section to provide dielectric breakdown higher voltage input (e.g., 2×VDD) to avoid including a potentially hazardous voltage on the FPGA or chip that may interact in unwanted ways during an extreme reliability event (e.g. radiation event, electromagnetic field exposure, etc). Once the selected MTJs have been blown/experienced dielectric layer breakdown and the reference MTJ 55 has been blown, "Blow" transistors 87 and "Finalize" transistor 105 will be asserted simultaneously while providing an "External Pad" 85B voltage. The finalize signal 105 will short out or cause dielectric breakdown to M[fin2] 103A allowing voltage across M[fin1] 103B to reach a level high enough to blow M[fin1] 103B (cause dielectric layer 25 breakdown). Once M[fin1] 103B is blown or experiences dielectric layer 25 breakdown, voltage is maintained on the "External Pad" 85B while deasserting Finalize transistor 105 which will blow M[fin2] 103A causing a permanent short or dielectric layer 25 breakdown from a the finalize transistor 105 that couples the "External Pad" 85B to "VSS" 49F. Thus, a node 102 between the External Pad 85 and the finalize transistor 105 will never reach a voltage high enough to blow or cause dielectric layer 25 breakdown of additional MTJs, converting at least this section of a FPGA such as shown herein from a MTP capability to a OTP capability permanently.

FIG. 13 shows an exemplary timing diagram illustrating different events in exemplary MTP and OTP modes. The diagram includes time on the X axis and resistance on the Y axis. There are two MTJ 21 cells labeled M[0] and M[1]. An unblown reference MTJ 55 M[ref] is also included to discriminate between parallel and antiparallel MTJs. Initially, at time t0, the exemplary LUT 9 is in MTP mode. M[0] is in antiparallel mode with a resistance larger 121 than a reference resistance 123 in M[ref] 55, corresponding to a logical values '1'. M[1] is in parallel mode with another resistance 125 smaller than the resistance 123 in M[ref] 55, corresponding to a logical values '0'. M[0], M[1] represent '1' and '0' logically respectively. At t1, the M[0] and M[1] cells remain in their configuration. M[0], M[1] represent '1' and '0' logically respectively. At t2, a program 41/89 operation is completed on M[0] to switch M[0] to the parallel state and change its logical value to a '0'. M[0], M[1] represent '0' and '0' logically respectively. At t3, a Blow 87 operation is completed on M[0] to create a direct short across the MTJ, significantly lowering the resistance 127. M[0], M[1] represent '1' and '0' logically respectively. At t4, a Blow_ref 99 operation is completed on M[ref] 55 to create a direct short across the selected MTJ 21, causing M[ref] to discriminate between unblown and blown MTJs. M[0], M[1] represent '0' and '1' logically respectively. At t5, an erase 43 operation is completed on M[1] to change to antiparallel. M[0], M[1] still represent '0' and '1' logically respectively as the M[ref] has been blown so that M[ref] only discriminates between blown and unblown cells.

Figure 14:
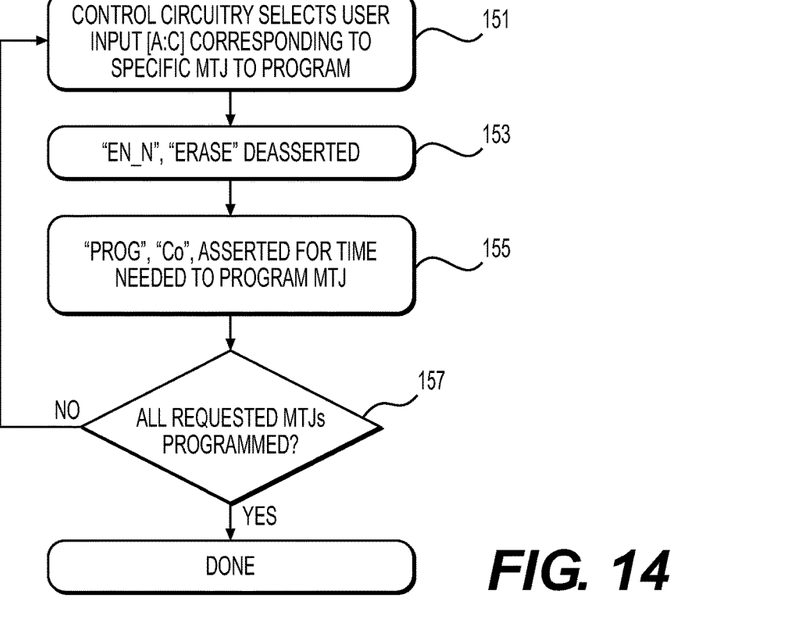
FIG. 14 shows an exemplary MTP Programming flowchart.

FIG. 14 shows an exemplary MTP Programming flowchart for using various embodiments of this invention in MTP mode while programming the configuration memory. At step 151, control circuitry (not shown) controls the LUT 9 via inputs to select bus line input 5A, 5B, 5C to address a specific MTJ 21 and thereby creating an electrical path through the LUT 9 to a corresponding selected MTJ 21 and the sense amp 33. At step 153, EN_N 51, Erase 43 are deasserted. At Step 155, Prog 41, Co 45 asserted for a predetermined time required to program a LUT 9 selected MTJ 21. At step 157, a determination is made on whether or all operator or system pre-selected MTJs 21 have been programmed where if yes, then programming operations terminate or if no then processing repeats at step 151 for another selected MTJ 21.

Figure 15:
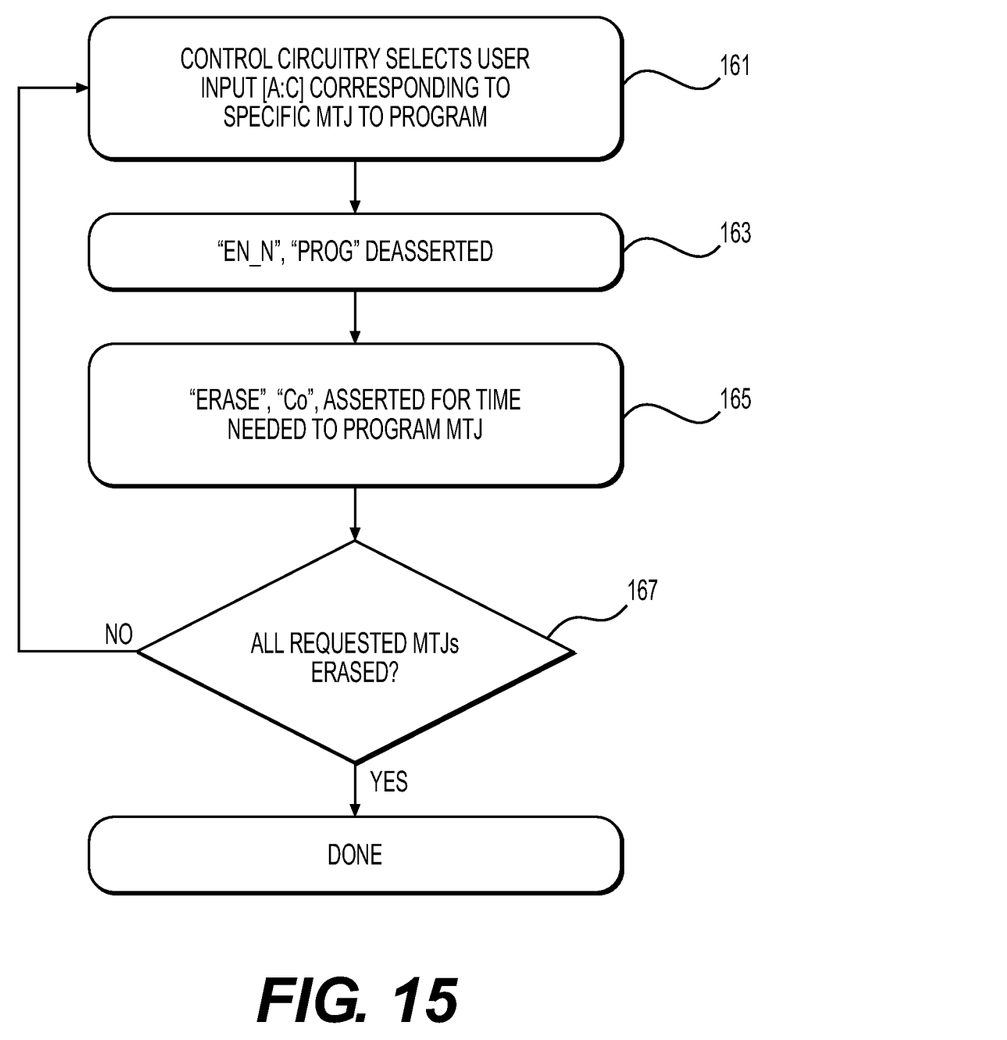
FIG. 15 shows an exemplary MTP Erasing flowchart.

FIG. 15 shows an exemplary MTP Erasing flowchart for using various embodiments to of the invention to finalize a MTJ 21 logic state or resistance value configuration. At step 161, control circuitry selects inputs e.g., A:C (e.g., one or more 5A, 5B, 5C) corresponding to a specific electrical path through the LUT 9 to a predetermined MTJ 21. At Step 163, EN_N 51, Prog 41 (and 63) are deasserted. At step 165, Erase 43, 61 and Co 45 are asserted for a predetermined time to erase a selected MTJ 21. At step 167, a determination is made on whether or not all user or system selected MTJs 21 have been erased; if yes, then erase operations are completed; if no, then processing recommences at step 161 with a different selected MTJ 21.

Figure 16:
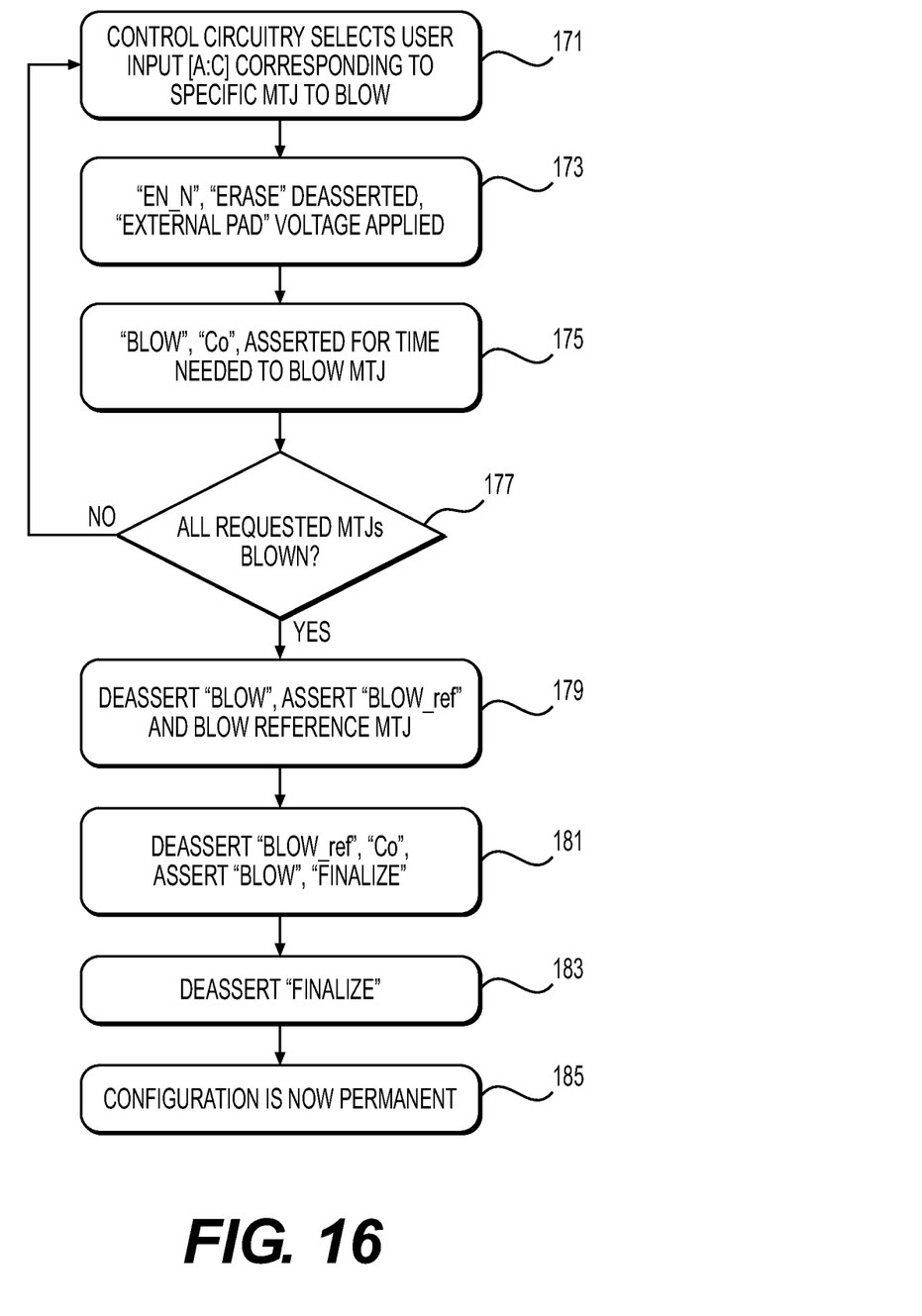
FIG. 16 shows an exemplary OTP flowchart.

FIG. 16 shows an exemplary OTP flowchart or sequence of operations controlling at least some embodiments of the invention such as shown in FIG. 12. At step 171, control circuitry selects user input A:C (e.g., 5A, 5B, and/or 5C) into LUT 9 creating or corresponding to a particular electrical path through the LUT 9 that enables dielectric breakdown current/voltage to pass through a selected MTJ 21 to blow or cause dielectric layer breakdown. At step 173, En_N 51 and Erase 43 are deasserted, external pad 85B receives dielectric layer voltage/current (e.g., 2×VDD). At step 175, Blow 87/89, Co 45 is asserted for a time needed to blow, short circuit, or cause dielectric layer breakdown in the LUT 9 selected MTJ 21. At step 177, determine if all desired or preselected MTJ 21s have been blown, short circuited, or had dielectric layer breakdown; if yes, then continue processing at step 179 to continue to deactivate an ability to cause dielectric layer breakdown via breakdown processing; if no, restart processing at step 171. At step 179, deassert Blow, assert Blow_ref, and thereby cause dielectric layer breakdown in the reference MTJ or M(ref) 55. At step 181, deassert Blow_ref transistor 99, Co isolation transistor 45; and assert Blow transistor pair 87/89 and Finalize transistor 105. At step deassert Finalize 105 then complete processing at sequence 185 when dielectric layer breakdown circuitry has been deactivated or rendered inoperative.

Although the invention has been described in detail with reference to certain preferred embodiments, variations and modifications exist within the spirit and scope of the invention as described and defined in the following claims.

The invention claimed is:

1. An method of selectively programming an electrical device comprising:
   providing a field programmable gate array comprising:
   a first signal input bus;
   a plurality of programmable logic section comprising a plurality of magnetic tunnel junction (MTJ) cell sections and a corresponding programmable logic circuit look up table (LUT) section, wherein the LUT section comprises one or more select bus lines and a plurality of LUT transistors each coupled with one or more said select bus lines, wherein the LUT section selectively reads out a logic state of one of said MTJ cell sections based on inputs of the one or more select bus lines, wherein each said MTJ comprises a free magnetic layer, a dielectric layer adjacent to the free magnetic layer, and a pinned magnetic layer adjacent to the dielectric layer, wherein the LUT section further comprises a reference signal section, the reference signal section includes a reference signal MTJ coupled in series with a metalized resistor;
   a programmable MTJ logic state sensing section comprising a sense amplifier that selectively receives reference signals from the reference signal section and a LUT section output from the LUT section, wherein the LUT section is controlled by the one or more select bus lines selectively couples one of the MTJs with the programmable MTJ logic state sensing section to read out the logic state of a selected said MTJ cell section;
   a program signal input transistor and an erase signal input transistor coupled with the first signal input bus;
   a read enable transistor disposed between a VSS source and the first signal input bus that selectively supplies s VSS to said inputs of the plurality of MTJ sections;
   a plurality of dielectric breakdown control circuitry sections comprising:
   a first dielectric breakdown control circuitry section that includes a first dielectric breakdown control transistor that selectively couples the VSS with the metalized resistor of the reference signal section;
   a second dielectric breakdown control circuitry section that comprises:

a dielectric layer breakdown circuit voltage source input section that receives a dielectric breakdown voltage signal that causes said dielectric layer in one of said MTJ sections selected by the LUT section and select bus line inputs to breakdown and thereby have a lower resistance than said dielectric layer had before said breakdown; and a second dielectric breakdown control transistor selectively couples the dielectric layer breakdown circuit voltage source input section to at least one of the plurality of programmable logic sections comprising respective said MTJ cell sections;

a third dielectric breakdown control circuitry section that comprises a third dielectric breakdown control transistor, a first finalizing MTJ, and a second finalizing MTJ, wherein the third dielectric breakdown control transistor is coupled in parallel with the first finalizing MTJ, wherein the second finalizing MTJ is coupled with the second dielectric breakdown control circuitry section, wherein the third dielectric breakdown control transistor is selectively coupled with the VSS; and a fourth dielectric breakdown control circuitry section that comprises a fourth dielectric breakdown control transistor coupled with an output of the LUT section that is controlled to operate in coordination with the second dielectric breakdown control circuitry section to selectively pass the dielectric breakdown voltage signal from the second dielectric breakdown control circuitry section through a LUT section selected MTJ;

wherein the first finalizing MTJ and the third dielectric breakdown control transistor is coupled with the VSS, wherein the first finalizing MTJ and the third dielectric breakdown control transistor is coupled with the second finalizing MTJ, wherein the second finalizing MTJ is coupled with the second dielectric breakdown control transistor and the first signal input bus;

an isolation transistor coupled with the first signal input bus that selectively isolates the plurality of MTJ sections and the read enable transistor from the second dielectric breakdown control circuitry section, the third dielectric breakdown control circuitry section, and the program signal input transistor and the erase signal input transistor;

operating a programmable system to selectively trigger dielectric layer breakdowns to convert programmable elements into non programmable elements, wherein said programmable elements include said MTJs.

2. An electric device comprising:

a first signal input bus;

a program signal input transistor and an erase signal input transistor coupled with the first signal input bus;

a read enable transistor disposed between a VSS source and the first signal input bus that selectively supplies a VSS to inputs of a plurality of magnetic tunnel junction (MTJ) sections;

a plurality of dielectric breakdown control circuitry sections comprising:

a first dielectric breakdown control circuitry section that includes a first dielectric breakdown control transistor that selectively couples the VSS with a metalized resistor of a reference signal section;

a second dielectric breakdown control circuitry section that comprises:

a dielectric layer breakdown circuit voltage source input section that receives a dielectric breakdown voltage signal that causes said dielectric layer in one of said MTJ sections selected by a look up table (LUT) section and select bus line inputs to breakdown and thereby have a lower resistance than said dielectric layer had before said breakdown; and a second dielectric breakdown control transistor selectively couples the dielectric layer breakdown circuit voltage source input section to at least one of a plurality of programmable logic sections comprising respective said MTJ cell sections;

a third dielectric breakdown control circuitry section that comprises a third dielectric breakdown control transistor, a first finalizing MTJ, and a second finalizing MTJ, wherein the third dielectric breakdown control transistor is coupled in parallel with the first finalizing MTJ, wherein the second finalizing MTJ is coupled with the second dielectric breakdown control circuitry section, wherein the third dielectric breakdown control transistor is selectively coupled with the VSS; and a fourth dielectric breakdown control circuitry section that comprises a fourth dielectric breakdown control transistor coupled with an output of the LUT section;

wherein the first finalizing MTJ and the third dielectric breakdown control transistor is coupled with the VSS, wherein the first finalizing MTJ and the third dielectric breakdown control transistor is coupled with the second finalizing MTJ, wherein the second finalizing MTJ is coupled with the second dielectric breakdown control transistor and the first signal input bus;

an isolation transistor coupled with the first signal input bus that selectively isolates the plurality of MTJ sections and the read enable transistor from the second dielectric breakdown control circuitry section, the third dielectric breakdown control circuitry section, and the program signal input transistor and the erase signal input transistor.

3. The device of claim 2, wherein the fourth dielectric breakdown section is controlled to operate in coordination with the second dielectric breakdown control circuitry section to selectively pass the dielectric breakdown voltage signal from the second dielectric breakdown control circuitry section through a LUT section selected MTJ.

4. A field programmable gate array comprising:

a first signal input bus;

a plurality of programmable logic section comprising a plurality of magnetic tunnel junction (MTJ) cell sections and a corresponding programmable logic circuit look up table (LUT) section, wherein the LUT section comprises one or more select bus lines and a plurality of LUT transistors each coupled with one or more said select bus lines, wherein the LUT section selectively reads out a logic state of one of said MTJ cell sections based on inputs of the one or more select bus lines, wherein each said MTJ comprises a free magnetic layer, a dielectric layer adjacent to the free magnetic layer, and a pinned magnetic layer adjacent to the dielectric layer, wherein the LUT section further comprises a reference signal section, the reference signal section includes a reference signal MTJ coupled in series with a metalized resistor;

a programmable MTJ logic state sensing section comprising a sense amplifier that selectively receives reference signals from the reference signal section and a LUT section output from the LUT section, wherein the LUT section is controlled by the one or more select bus lines selectively couples one of the MTJs with the programmable MTJ logic state sensing section to read out the logic state of a selected said MTJ cell section;

a program signal input transistor and an erase signal input transistor coupled with the first signal input bus;

a read enable transistor disposed between a VSS source and the first signal input bus that selectively supplies a VSS to said inputs of the plurality of MTJ sections;

a plurality of dielectric breakdown control circuitry sections comprising:
  a first dielectric breakdown control circuitry section that includes a first dielectric breakdown control transistor that selectively couples the VSS with the metalized resistor of the reference signal section;
  a second dielectric breakdown control circuitry section that comprises:
    a dielectric layer breakdown circuit voltage source input section that receives a dielectric breakdown voltage signal that causes said dielectric layer in one of said MTJ sections selected by the LUT section and select bus line inputs to breakdown and thereby have a lower resistance than said dielectric layer had before said breakdown; and
    a second dielectric breakdown control transistor selectively couples the dielectric layer breakdown circuit voltage source input section to at least one of the plurality of programmable logic sections comprising respective said MTJ cell sections;
  a third dielectric breakdown control circuitry section that comprises a third dielectric breakdown control transistor, a first finalizing MTJ, and a second finalizing MTJ, wherein the third dielectric breakdown control transistor is coupled in parallel with the first finalizing MTJ, wherein the second finalizing MTJ is coupled with the second dielectric breakdown control circuitry section, wherein the third dielectric breakdown control transistor is selectively coupled with the VSS; and
  a fourth dielectric breakdown control circuitry section that comprises a fourth dielectric breakdown control transistor coupled with an output of the LUT section that is controlled to operate in coordination with the second dielectric breakdown control circuitry section to selectively pass the dielectric breakdown voltage signal from the second dielectric breakdown control circuitry section through a LUT section selected MTJ;

wherein the first finalizing MTJ and the third dielectric breakdown control transistor is coupled with the VSS, wherein the first finalizing MTJ and the third dielectric breakdown control transistor is coupled with the second finalizing MTJ, wherein the second finalizing MTJ is coupled with the second dielectric breakdown control transistor and the first signal input bus;

an isolation transistor coupled with the first signal input bus that selectively isolates the plurality of MTJ sections and the read enable transistor from the second dielectric breakdown control circuitry section, the third dielectric breakdown control circuitry section, and the program signal input transistor and the erase signal input transistor.

* * * * *